(12) United States Patent
Nshikawa et al.

(10) Patent No.: US 7,659,664 B2
(45) Date of Patent: Feb. 9, 2010

(54) SYSTEM FOR DISPLAYING IMAGE

(75) Inventors: Ryuji Nshikawa, Hsinchu (TW); Chih-Kuo Tseng, Changhua County (TW); Hsiang-Lun Hsu, Miaoli (TW)

(73) Assignee: TPO Displays Corp., Chu-Nan, Miao-Li County (TW)

( * ) Notice: Subject to any disclaimer, the term of this patent is extended or adjusted under 35 U.S.C. 154(b) by 0 days.

(21) Appl. No.: 11/806,030

(22) Filed: May 29, 2007

(65) Prior Publication Data

US 2007/0278940 A1 Dec. 6, 2007

(30) Foreign Application Priority Data

May 30, 2006 (CN) .......................... 2006 1 0092437
May 30, 2006 (TW) ............................... 95119261 A

(51) Int. Cl.
*H01J 63/04* (2006.01)
*H01J 1/62* (2006.01)

(52) U.S. Cl. ...................... 313/506; 313/483; 313/500; 313/504; 313/505

(58) Field of Classification Search ........................ None
See application file for complete search history.

(56) References Cited

U.S. PATENT DOCUMENTS

| | | | | |
|---|---|---|---|---|
| 6,627,332 B2 * | 9/2003 | Utsugi et al. | ................. | 428/690 |
| 6,660,411 B2 * | 12/2003 | Sato et al. | .................... | 313/504 |
| 6,815,723 B2 * | 11/2004 | Yamazaki et al. | ............. | 257/88 |
| 6,894,312 B2 | 5/2005 | Yamazaki et al. | | |
| 6,967,435 B2 | 11/2005 | Park et al. | | |
| 2004/0195963 A1 * | 10/2004 | Choi et al. | .................. | 313/504 |
| 2005/0218768 A1 | 10/2005 | Saito | | |

FOREIGN PATENT DOCUMENTS

EP 1 441 571 A1 7/2004

\* cited by examiner

*Primary Examiner*—Nimeshkumar D. Patel
*Assistant Examiner*—Natalie K Walford
(74) *Attorney, Agent, or Firm*—Birch, Stewart, Kolasch & Birch, LLP

(57) ABSTRACT

A system for displaying an image includes a plurality of pixels each having a first organic light-emitting device (OLED), a second OLED and a third OLED. The pixel includes a first electrode layer, a first organic light-emitting layer, a second organic light-emitting layer, a second electrode layer and a color filter. The first organic light-emitting layer is disposed on the first electrode layer and within the first OLED and the second OLED. The second organic light-emitting layer is disposed on the first electrode layer and within the second OLED and the third OLED so that the first and second organic light-emitting layers overlap within the second OLED. The second electrode layer is disposed on the first organic light-emitting layer and the second organic light-emitting layer. The color filter is disposed within the second OLED.

16 Claims, 7 Drawing Sheets

SYSTEM FOR DISPLAYING IMAGE

BACKGROUND OF THE INVENTION

1. Field of Invention

The invention relates to a system for displaying an image, and, in particular, to an image displaying system having organic light-emitting devices.

2. Related Art

An organic light-emitting device (OLED) has the advantages of self-emissive property, high luminance, high contrast, light weight, thin profile, low power-consumption and fast response speed. Due to these desirable qualities, it is becoming ever more widely used in various image displaying systems.

The OLED mainly includes a cathode, an electron transporting layer, an organic light-emitting layer, a hole transporting layer and an anode. The organic light-emitting layer is disposed between the electron transporting layer and the hole transporting layer. The cathode provides electrons to be injected into the electron transporting layer. The anode provides holes to be injected into the hole transporting layer. The electrons and the holes are respectively ejected from the electron transporting layer and the hole transporting layer and are recombined in the organic light-emitting layer so that the organic light-emitting layer emits light. Moreover, the OLED often serves as a pixel or a sub-pixel of the image displaying system.

Referring to FIG. 1a, a conventional image displaying system has a plurality of OLEDs, and three OLEDs may constitute a full-color pixel. A pixel 1 includes three OLEDs 11 to 13, and each of the OLED 11 to 13 has a transparent electrode layer 14, a red light organic light-emitting layer 15r, a blue light organic light-emitting layer 15b, a green light organic light-emitting layer 15g and a cathode reflective layer 16. The transparent electrode layer 14 has three transparent electrodes 141 to 143 respectively pertaining to the OLEDs 11 to 13. In addition, the red light organic light-emitting layer 15r, the blue light organic light-emitting layer 15b and the green light organic light-emitting layer 15g are sequentially disposed on the transparent electrodes 141 to 143, and the cathode reflective layer 16 is disposed on the organic light-emitting layers 15r, 15g and 15b. In addition, in order to increase the lighting efficiency, each of the OLEDs 11 to 13 may further include a hole transporting layer 17 disposed between the transparent electrode layer 14 and the red light organic light-emitting layer 15r, and an electron transporting layer 18 disposed between the green light organic light-emitting layer 15g and the cathode reflective layer 16. Herein, the red light organic light-emitting layer 15r may emit red light, the blue light organic light-emitting layer 15b may emit blue light, the green light organic light-emitting layer 15g may emit green light. The red light, the blue light and the green light are mixed to form white light.

In addition, the OLED 11 further has a red light filter 111 disposed opposite to the transparent electrode 141. The OLED 12 further has a blue light filter 121 disposed opposite to the transparent electrode 142. The OLED 13 further has a green light filter 131 disposed opposite to the transparent electrode 143. Thus, the white light is filtered to form the red light, the blue light and the green light such that the full-color displaying effect can be achieved.

When the OLEDs 11 to 13 are being manufactured, the red light organic light-emitting layer 15r, the blue light organic light-emitting layer 15b and the green light organic light-emitting layer 15g are sequentially deposited on the transparent electrode layer 14. When the red light organic light-emitting layer 15r, the blue light organic light-emitting layer 15b and the green light organic light-emitting layer 15g are disposed on the transparent electrodes 141 to 143, only one metal mask is used in the evaporating procedure. This is very advantageous to the manufacture of the OLEDs 11 to 13 because the yields of the OLEDs 11 to 13 may be influenced if the precision of the metal mask is not very highly controlled and the metal mask cannot be aligned very precisely. However, because each of the OLEDs 11 to 13 needs one filter for filtering, three manufacturing processes have to be performed to form three filters with different colors. Thus, the manufacturing processes are complicated, and the light intensity of each of the OLEDs 11 to 13 is absorbed by the corresponding filter so that the lighting efficiency of the OLED is decreased. In addition, if the light intensity has to be increased, the currents flowing through the OLEDs 11 to 13 have to be increased, thereby shortening the lifetime of each OLED.

Another pixel 1', as shown in FIG. 1b, is different from the pixel 1 because the pixel 1' only has a red light organic light-emitting layer 15r' and a blue light organic light-emitting layer 15b'. The red light emitted from the red light organic light-emitting layer 15r' and the blue light emitted from the blue light organic light-emitting layer 15b' are mixed to form the white light, and the red light filter 111, the blue light filter 121 and the green light filter 131 are utilized to filter the white light into the red light, the blue light and the green light respectively so as to achieve the full-color displaying effect. Herein, the distributions of the lighting wavelengths of the red light organic light-emitting layer 15r' and the blue light organic light-emitting layer 15b' are respectively wider than those of the red light organic light-emitting layer 15r and the blue light organic light-emitting layer 15b of the pixel 1 so that the good light mixing effect can be achieved. As mentioned hereinabove, this pixel 1' also has to be manufactured using three manufacturing processes to form the filters with various colors. So, the manufacturing processes are also complicated, the lighting intensity of each OLED is partially absorbed by the filter, the lighting efficiency of each OLED is likewise reduced, and the lifetime of each OLED is shortened.

As shown in FIG. 2, still another conventional pixel 2 includes three OLEDs 21 to 23 each having a transparent electrode layer 24. The transparent electrode layer 24 has three transparent electrodes 241 to 243 respectively pertaining to the OLEDs 21 to 23. In addition, the OLED 21 has a red light organic light-emitting layer 25r disposed on the transparent electrode 241. The OLED 22 has a blue light organic light-emitting layer 25b disposed on the transparent electrode 242. The OLED 23 has a green light organic light-emitting layer 25g disposed on the transparent electrode 243. In addition, the OLEDs 21 to 23 further have a cathode reflective layer 26 disposed on the red light organic light-emitting layer 25r, the blue light organic light-emitting layer 25b and the green light organic light-emitting layer 25g.

The OLEDs 21 to 23 may respectively output the red light, the blue light and the green light so as to achieve the full-color displaying effect. Because no filter is needed in the OLEDs 21 to 23, the lighting efficiency of each of the OLEDs 21 to 23 may be ensured. However, because the organic light-emitting layers 25r, 25b and 25g are respectively disposed on the transparent electrodes 241 to 243, three metal masks in precise alignment with one another have to be utilized in the evaporating procedure. This is very difficult in the manufacturing processes for high-resolution panel because the yields of the OLEDs 21 to 23 are restricted by the precision and alignment of the metal masks. In addition, the opening of each metal mask is smaller than that of the metal mask used to form the pixel 1 so that the precision has to be higher and the yields of the OLEDs 21 to 23 are thus reduced.

Thus, it is an important subject of the invention to provide an image displaying system having OLEDs, which are manufactured using the reduced number of metal masks, and the reduced number of color filters. Also, the opening of the metal mask is enlarged in order to enhance the yield and the efficiency of each OLED. Thus, the lighting efficiency of the OLED may be enhanced, and the lifetime thereof can be lengthened.

SUMMARY OF THE INVENTION

In view of the foregoing, the invention is to provide an image displaying system having OLEDs, which are manufactured with the reduced number of metal masks, with the enlarged openings of the metal masks, with enhanced yield and efficiency and with fewer color filters so that the lighting efficiency of the OLED can be enhanced and the lifetime of the OLED may be increased.

To achieve the above, an image displaying system according to the invention includes a plurality of pixels. Each pixel has a first OLED, a second OLED and a third OLED and including a first electrode layer, a first organic light-emitting layer, a second organic light-emitting layer, a second electrode layer and a color filter. The first organic light-emitting layer is disposed on the first electrode layer and within the first and second OLEDs. The second organic light-emitting layer is disposed on the first electrode layer and within the second and third OLEDs so that the first and second organic light-emitting layers overlap within the second OLED. The second electrode layer is disposed on the first organic light-emitting layer and the second organic light-emitting layer. The color filter is disposed within the second OLED.

As mentioned above, the OLED of the image displaying system of the invention needs only two organic light-emitting layers, so the evaporation procedure only needs two metal masks. Compared with the prior art of individually forming three colors of organic light-emitting layers using three metal masks, the invention saves one metal mask so that the manufacturing cost can be reduced and the manufacturing steps can be simplified. In addition, the first organic light-emitting layer and the second organic light-emitting layer of the invention are respectively disposed within two OLEDs, while each color of the organic light-emitting layer is disposed within one OLED in the prior art. So, the opening of the metal mask used in this invention is relatively large, the precision requirement and the cost of the metal mask can be reduced, and the yield and the efficiency of the OLED may be enhanced. In addition, the OLED of the invention only needs one color filter disposed within the second OLED. Thus, two color filters can be saved, the manufacturing cost and manufacturing time of the color filter may be reduced, and the yield may be enhanced. The OLED of the invention can also greatly increase the lighting efficiency and thus lengthen the lifetime of the image displaying system.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
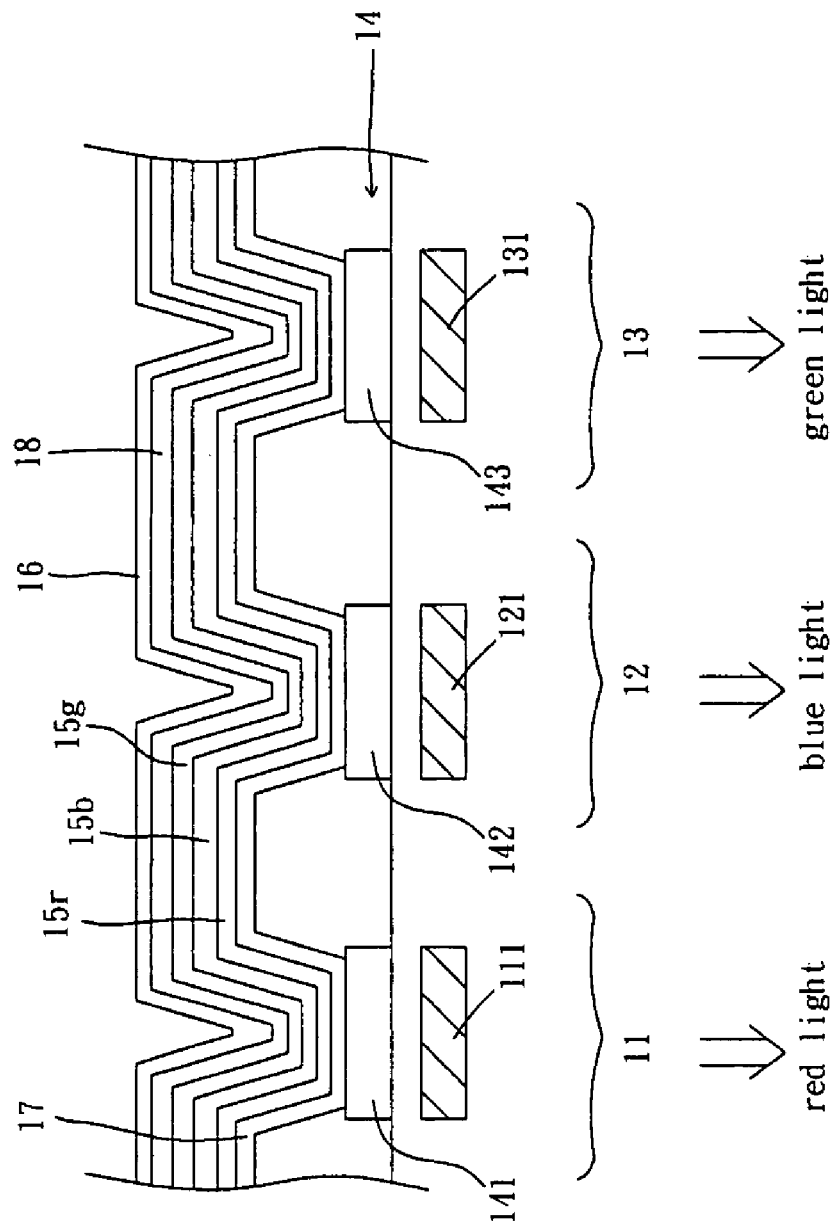
FIG. 1*a* is a schematic illustration showing a pixel composed of OLEDs according to the prior art.
Figure 1B:
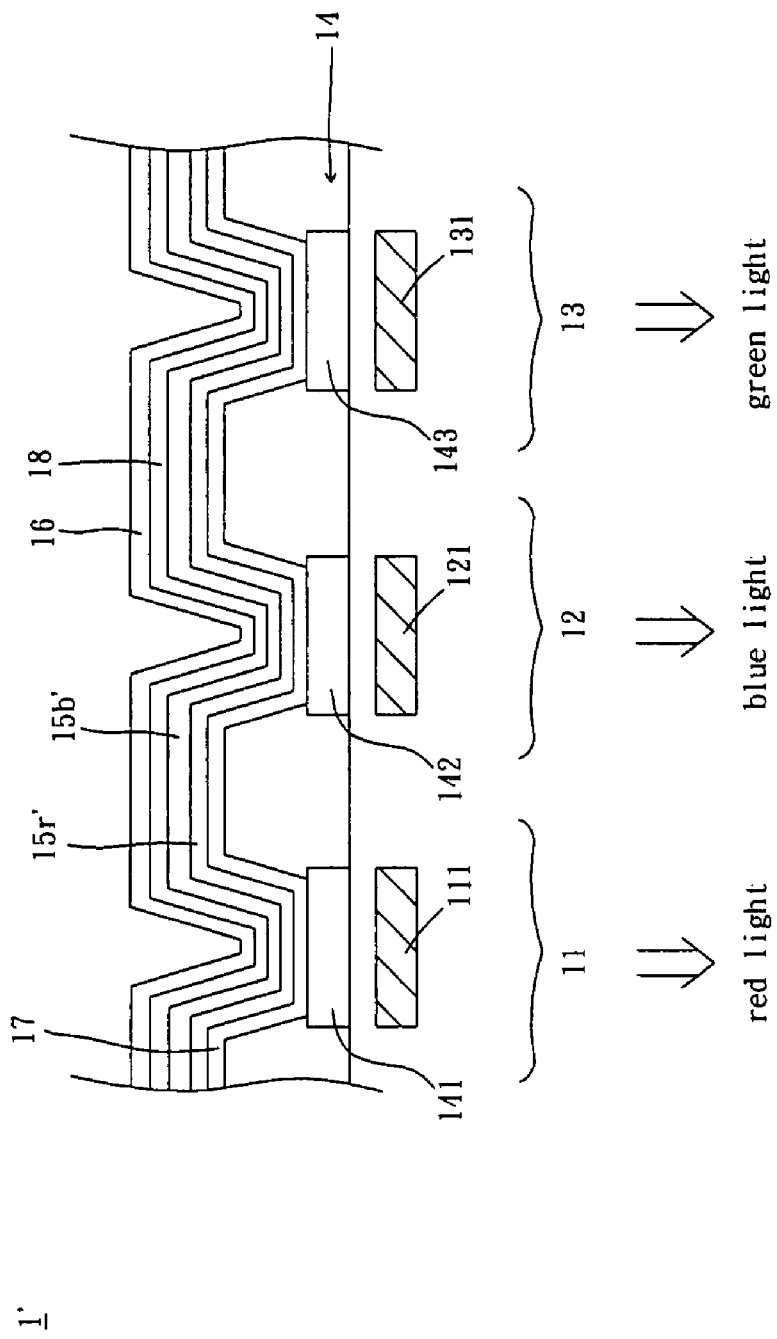
FIG. 1*b* is a schematic illustration showing another pixel composed of OLEDs according to the prior art.
Figure 2:
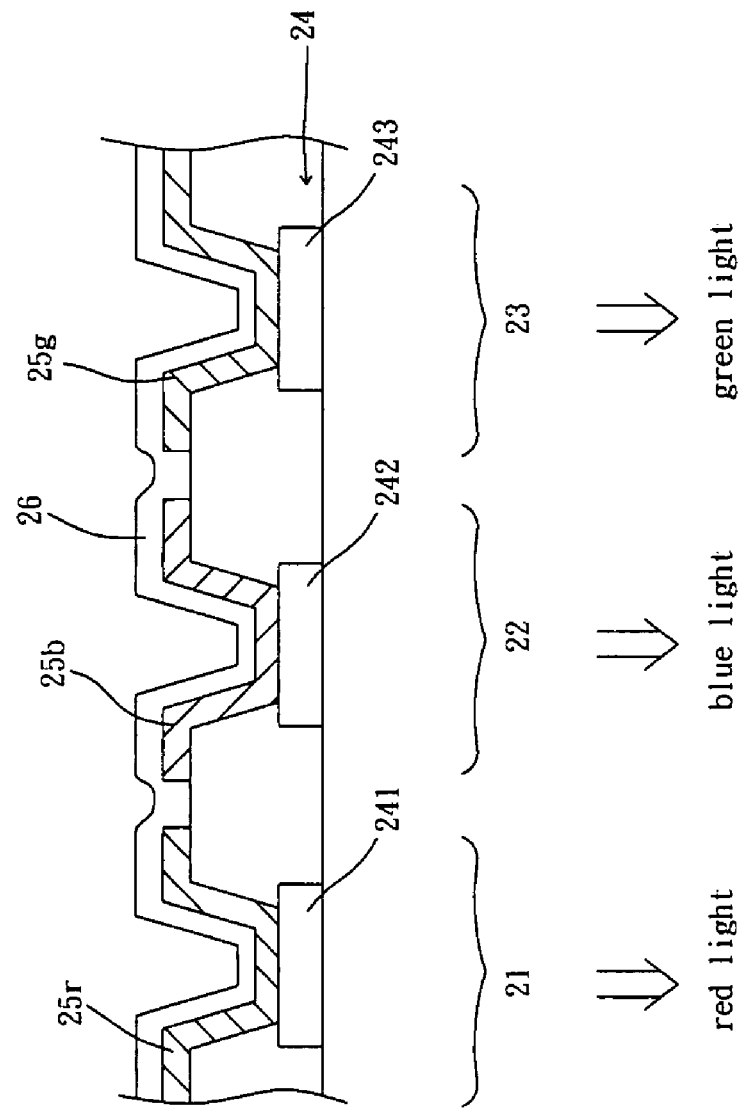
FIG. 2 is a schematic illustration showing still another pixel composed of OLEDs according to the prior art.
Figure 3:
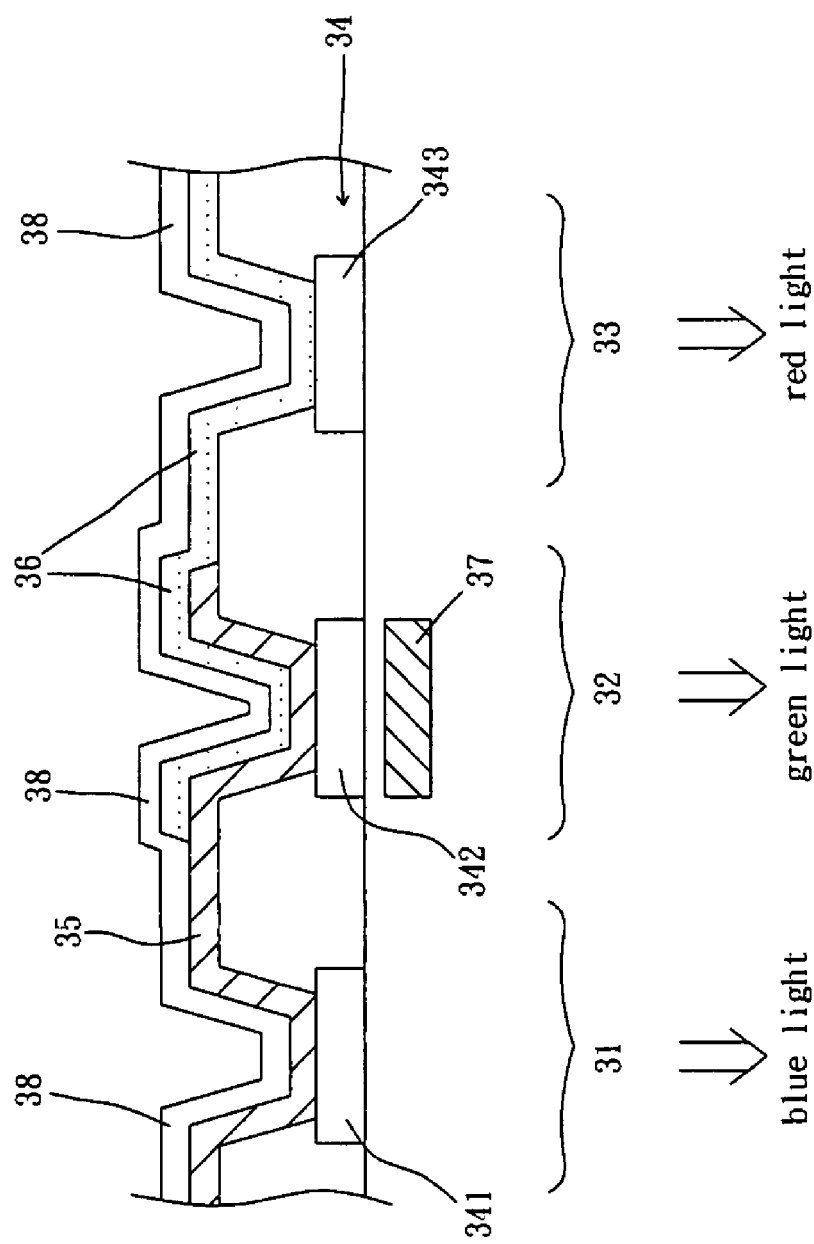
FIG. 3 is a schematic illustration showing a pixel composed of OLEDs in an image displaying system according to a preferred embodiment of the invention.

FIG. 3 is a schematic illustration showing a pixel composed of OLEDs in an image displaying system according to an embodiment of the invention. Referring to FIG. 3, the image displaying system according to the preferred embodiment of the invention includes a plurality of pixels each including a first OLED 31, a second OLED 32 and a third OLED 33. The OLEDs 31 to 33 constitute a pixel 3. The pixel 3 includes a first electrode layer 34, a first organic light-emitting layer 35, a second organic light-emitting layer 36 and a second electrode layer 38. The first electrode layer 34 has three first electrodes 341 to 343 respectively pertaining to the OLEDs 31 to 33. In addition, the first organic light-emitting layer 35 is disposed on the first electrode layer 34 and within the first OLED 31 and the second OLED 32. The second organic light-emitting layer 36 is disposed on the first electrode layer 34 and within the second OLED 32 and the third OLED 33 so that the first organic light-emitting layer 35 and the second organic light-emitting layer 36 overlap within the second OLED 32. The formation sequence of the first and second organic light-emitting layers 35 and 36 is not limited. That is, the first organic light-emitting layer 35 can be formed prior to the second organic light-emitting layer 36 and disposed below the second organic light-emitting layer 36 in the second OLED 32 as shown in FIG. 3. Or, alternatively, the first organic light-emitting layer 35 can be formed after the second organic light-emitting layer 36 and disposed above the second organic light-emitting layer 36 in the second OLED 32. In addition, the second electrode layer 38 is disposed on the first organic light-emitting layer 35 and the second organic light-emitting layer 36 so that the first organic light-emitting layer 35 and the second organic light-emitting layer 36 are disposed between the first electrode layer 34 and the second electrode layer 38.

In this embodiment, the first OLED 31, the second OLED 32 and the third OLED 33 are disposed adjacent to one another. However, the OLEDs 31 to 33 do not have to be disposed adjacent to one another in other embodiments. For example, the first OLED 31, the third OLED 33 and the second OLED 32 could also be respectively disposed in the named order.

In addition, the pixel 3 of this embodiment may further include a color filter 37 disposed opposite to a position that the first organic light-emitting layer 35 and the second organic light-emitting layer 36 overlap. That is, the color filter 37 is disposed within the second OLED 32.

In this embodiment, the first electrode layer 34 can be a transparent electrode layer, and the first electrodes 341 to 343 of the first electrode layer 34 can be transparent electrodes, which may be made of transparent conductive materials including, without being limited to, indium-tin oxide (ITO), indium-zinc oxide (IZO) or aluminum-zinc oxide (AZO).

In addition, the first organic light-emitting layer 35 and the second organic light-emitting layer 36 can be made of the small-molecule organic material or polymeric organic material. In this embodiment, the first organic light-emitting layer 35 can emit blue light, and the second organic light-emitting layer 36 can emit red light. The peak value of the lighting wavelength of the first organic light-emitting layer 35 may range from about 470 nm to 500 nm, and may be 490 nm, for example. The peak value of the lighting wavelength of the second organic light-emitting layer 36 may range from about 570 nm to 620 nm. Of course, the peak values of the lighting wavelengths of the first organic light-emitting layer 35 and the second organic light-emitting layer 36 may be slightly adjusted to achieve the required lighting effects. In addition, the second electrode layer 38 serves as a cathode electrode layer, which can be usually made of a metal material or an alloy material.

Herein, because the first organic light-emitting layer 35 emits blue light and the second organic light-emitting layer 36 emits red light, the first OLED 31 and the third OLED 33 respectively output the blue light and the red light. In addition, the second OLED 32 originally outputs white light by proportionally mixing the blue light and the red light, and the resultant white light then passes through a color filter 37. In the embodiment of this invention, the color filter 37 can be a green color filter, so that the second OLED 32 can finally output green light. Thus, the OLEDs 31 to 33 can respectively output blue light, green light and red light, which are the three primary colors of light, so that the full-color displaying effect can be achieved. In this embodiment, the OLEDs 31 to 33 are bottom-emission OLEDs. Alternatively, the OLEDs 31 to 33 can also be top-emission OLEDs. In addition, the OLEDs 31 to 33 can be driven actively or passively.

Figure 4:
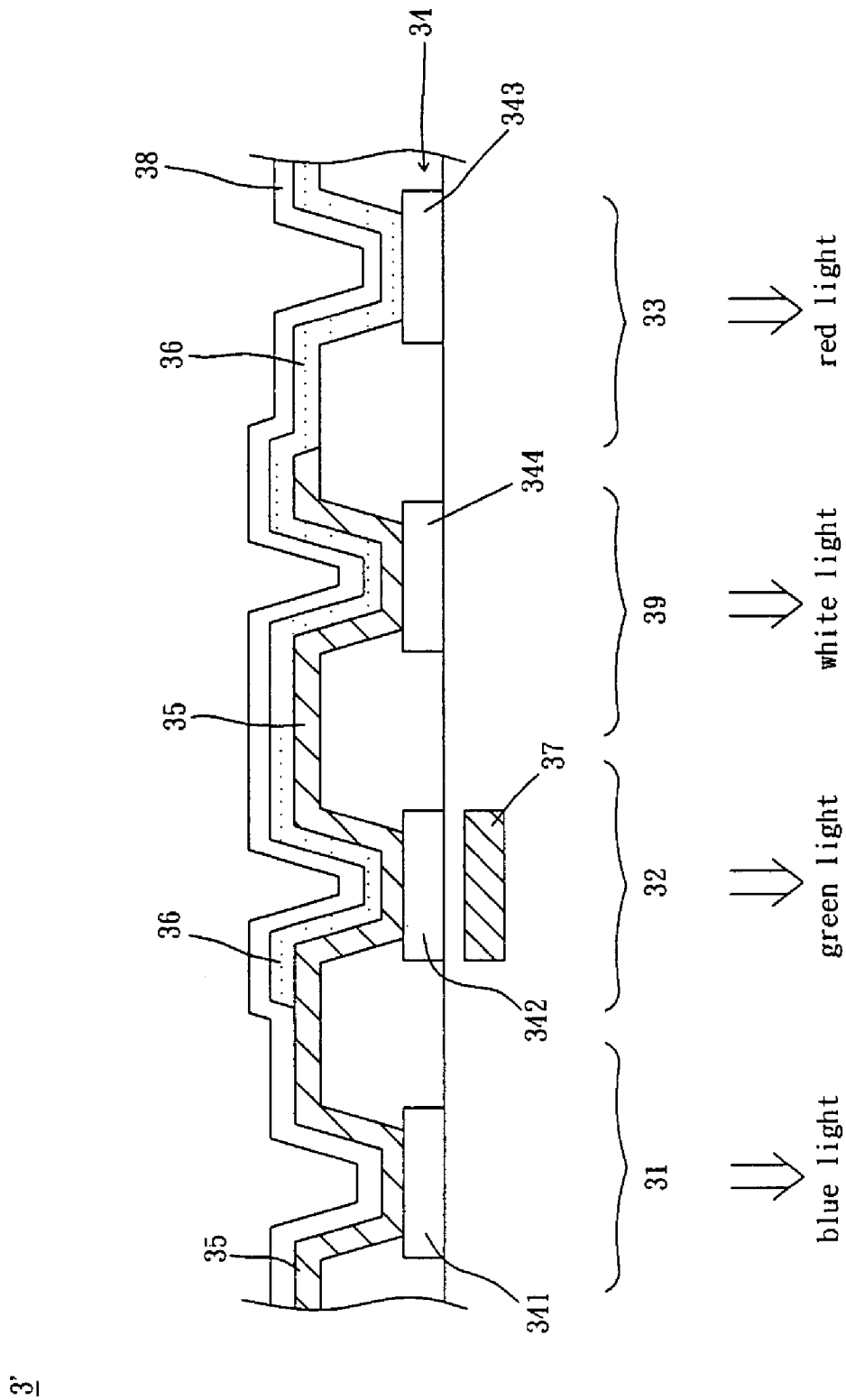
FIG. 4 is a schematic illustration showing another pixel composed of OLEDs in the image displaying system according to the preferred embodiment of the invention.

Referring to FIG. 4, the image displaying system according to an embodiment of the invention further includes a fourth OLED 39. The OLEDs 31 to 33 and 39 constitute a pixel 3'. The fourth OLED 39 is disposed between the second OLED 32 and the third OLED 33. Herein, the first electrode layer 34 has four first electrodes 341 to 344, wherein the first electrode 344 is disposed within the fourth OLED 39. In this case, the first organic light-emitting layer 35 and the second organic light-emitting layer 36 are respectively disposed within three of the first electrodes 341 to 344. The first organic light-emitting layer 35 can be disposed within the first OLED 31, the second OLED 32 and the third OLED 33. The second organic light-emitting layer 36 can be disposed within the second OLED 32, the third OLED 33 and the fourth OLED 39. That is, the first organic light-emitting layer 35 and the second organic light-emitting layer 36 overlap within the second OLED 32 and the fourth OLED 39. The formation sequence of the first and second organic light-emitting layers 35 and 36 is not limited. That is, the first organic light-emitting layer 35 can be formed prior to the second organic light-emitting layer 36 and disposed below the second organic light-emitting layer 36 in the second and fourth OLEDs 32 and 39 as shown in FIG. 4. Or, alternatively, the first organic light-emitting layer 35 can be formed after the second organic light-emitting layer 36 and disposed above the second organic light-emitting layer 36 in the second and fourth OLEDs 32 and 39. In addition, the color filter 37 can be disposed within the second OLED 32. In this embodiment, the first organic light-emitting layer 35 can emit blue light, and the second organic light emitting layer 36 can emit red light. The second and fourth OLEDs 32 and 39 can originally output white light by proportionally mixing the blue and the red light. The color filter 37 can be a green color filter. Thus, the OLEDs 31, 32, 39 and 33 may respectively output blue light, green light, white light and red light. In addition to the three primary colors of light, white light is added so that the overall efficiency of the OLEDs 31 to 33 and 39 may be enhanced.

As shown in FIGS. 3 and 4, the image displaying system of this embodiment can be applied to a full-color display, so each of the OLEDs 31 to 33 and 39 is a sub-pixel. Of course, if the image displaying system is applied to other display aspects, such as the monochromatic display, each of the OLEDs 31 to 33 and 39 constitutes a pixel.

Figure 5:
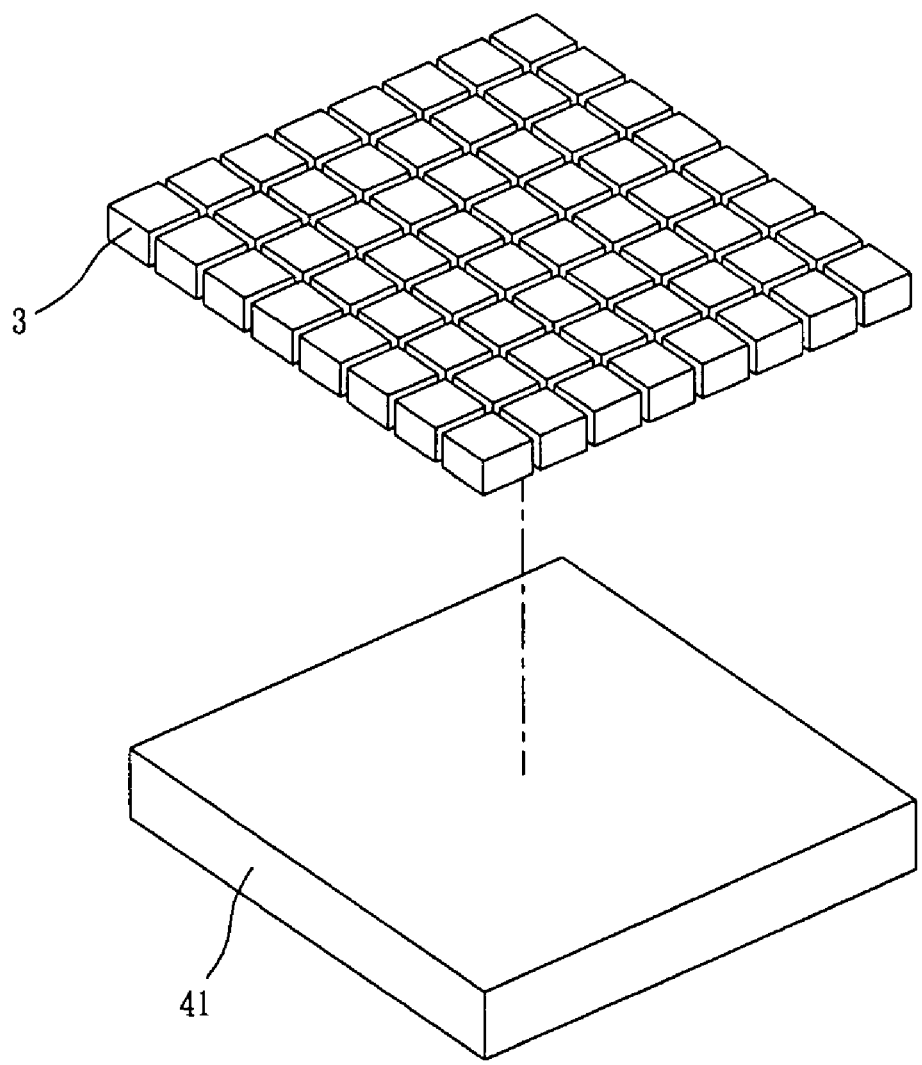
FIG. 5 is a schematic illustration showing an organic light-emitting panel of the image displaying system according to the preferred embodiment of the invention.

As shown in FIG. 5, a plurality of pixels 3 can be disposed on a substrate 41 and arranged in an array to constitute an organic light-emitting diode panel 4. Herein, the substrate 41 may be a thin film transistor array substrate, and the pixels 3 can be driven actively. In addition, the substrate 41 may be a rigid substrate, such as a glass substrate or a silicon substrate, or a flexible substrate, such as a plastic substrate.

Figure 6:
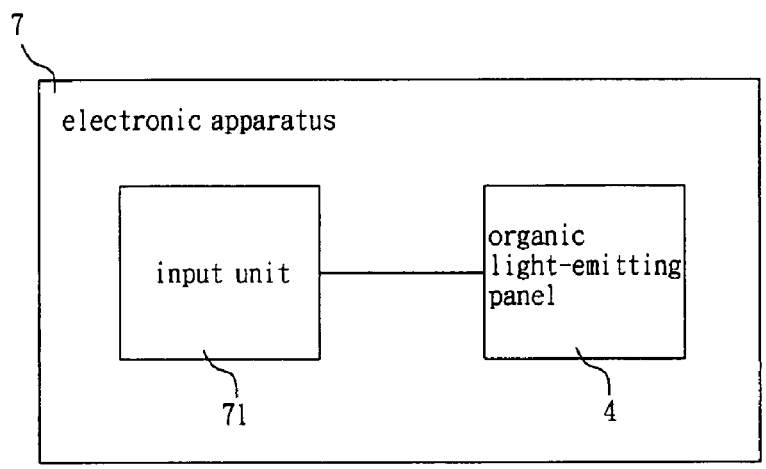
FIG. 6 is a block diagram showing an electronic apparatus of the image displaying system according to the preferred embodiment of the invention.

Referring to FIG. 6, an image displaying system 6 according to an embodiment of the invention further includes an electronic apparatus 7 having the organic light-emitting diode panel 4 and an input unit 71, which is coupled to the organic light-emitting diode panel 4 and provides an input to the organic light-emitting diode panel 4 to enable the organic light-emitting panel 4 to display an image. In this embodiment, the electronic apparatus 7 may be a mobile phone, a digital camera, a personal digital assistant, a notebook computer, a desktop computer, a television, a mobile display or a portable DVD player.

In summary, the OLED of the image displaying system of the invention needs only two organic light-emitting layers, so the evaporation procedure only needs two metal masks. Compared with the prior art of individually forming three colors of organic light-emitting layers using three metal masks, the invention saves one metal mask so that the manufacturing cost can be reduced and the manufacturing steps can be simplified. In addition, the first organic light-emitting layer and the second organic light-emitting layer of the invention are respectively disposed within two or three OLEDs, while each color of the organic light-emitting layer is disposed within one OLED in the prior art. So, the opening of the metal mask used in this invention is relatively large, the precision requirement and the cost of the metal mask can be reduced, and the yield and the efficiency of the OLED may be enhanced. In addition, the OLED of the invention only needs one color filter disposed within the second OLED. Thus, two color filters can be saved, the manufacturing cost and manufacturing time of the color filters may be reduced, and the yield may be enhanced. The OLED of the invention can also greatly increase the lighting efficiency and thus lengthen the lifetime of the image displaying system.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An image displaying system comprising a plurality of pixels each having a first organic light-emitting device (OLED), a second OLED and a third OLED, the pixel comprising:
   a first electrode layer;
   a first organic light-emitting layer disposed on the first electrode layer and within the first OLED and the second OLED;
   a second organic light-emitting layer disposed on the first electrode layer and within the second OLED and the third OLED, wherein the first organic light-emitting layer and the second organic light-emitting layer overlap within the second OLED;
   a second electrode layer disposed on the first organic light-emitting layer and the second organic light-emitting layer; and
   a color filter disposed within the second OLED,
   wherein the first organic light-emitting layer and the second organic light-emitting layer overlap within the entire second OLED.

2. The system according to claim 1, wherein the pixels are disposed on a substrate to constitute an organic light-emitting diode panel.

3. The system according to claim 2, wherein the pixels are arranged in an array.

4. The system according to claim 2, wherein the substrate is a thin film transistor array substrate.

5. The system according to claim 1, wherein the first organic light-emitting layer emits blue light, and the second organic light-emitting layer emits red light.

6. The system according to claim 5, wherein a peak value of a lighting wavelength of the first organic light-emitting layer substantially ranges from 470 nm to 500 nm.

7. The system according to claim 5, wherein a peak value of a lighting wavelength of the second organic light-emitting layer substantially ranges from 570 nm to 620 nm.

8. The system according to claim 5, wherein the color filter is a green light filter.

9. The system according to claim 1, wherein the first organic light-emitting layer emits blue light, the second organic light-emitting layer emits red light and the color filter is a green light filter so that the first OLED, the second OLED and the third OLED respectively output the blue light, green light and the red light.

10. The system according to claim 1, wherein the pixel further comprises a fourth OLED, and the first organic light-emitting layer and the second organic light-emitting layer overlap in the fourth OLED.

11. The system according to claim 10, wherein the first organic light-emitting layer emits blue light, the second organic light-emitting layer emits red light and the color filter is a green light filter so that the first OLED, the second OLED, the third OLED and the fourth OLED respectively output the blue light, green light, the red light and white light.

12. The system according to claim 1, wherein the OLEDs are top-emission OLEDs or bottom-emission OLEDs.

13. The system according to claim 2, further comprising:
   an electronic apparatus having the organic light-emitting diode panel and an input unit, wherein the input unit is coupled to the organic light-emitting panel and provides an input to the organic light-emitting panel to enable the organic light-emitting panel to display an image.

14. The system according to claim 13, wherein the electronic apparatus is a mobile phone, a digital camera, a personal digital assistant (PDA), a notebook computer, a desktop computer, a television, a mobile display or a portable DVD player.

15. The system according to claim 1, wherein the color filter is only disposed within the second OLED.

16. The system according to claim 1, wherein the first OLED, the second OLED, and third OLED respectively emit different color lights.

* * * * *